United States Patent
Asai et al.

(10) Patent No.: US 7,489,040 B2
(45) Date of Patent: Feb. 10, 2009

(54) INTERCONNECTION STRUCTURE OF SEMICONDUCTOR DEVICE

(75) Inventors: Koyu Asai, Hyogo (JP); Hiroshi Tobimatsu, Hyogo (JP); Hiroyuki Kawata, Nagano (JP); Mahito Sawada, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 96 days.

(21) Appl. No.: 11/635,495

(22) Filed: Dec. 8, 2006

(65) Prior Publication Data

US 2007/0096322 A1    May 3, 2007

Related U.S. Application Data

(63) Continuation of application No. 10/725,384, filed on Dec. 3, 2003, now Pat. No. 7,154,184.

(30) Foreign Application Priority Data

Jun. 10, 2003    (JP) ............................... 2003-165013

(51) Int. Cl.
*H01L 23/48* (2006.01)
(52) U.S. Cl. .................. 257/775; 257/774; 257/773
(58) Field of Classification Search .................. None
See application file for complete search history.

(56) References Cited

U.S. PATENT DOCUMENTS

| | | | |
|---|---|---|---|
| 4,855,252 A * | 8/1989 | Peterman et al. ............ | 438/624 |
| 5,815,226 A | 9/1998 | Yamazaki et al. | |
| 5,998,814 A | 12/1999 | Yamaha et al. | |
| 6,107,687 A | 8/2000 | Fukada et al. | |
| 6,150,723 A | 11/2000 | Harper et al. | |
| 6,414,393 B2 | 7/2002 | Sumino et al. | |
| 7,154,184 B2 * | 12/2006 | Asai et al. ............ | 257/775 |

FOREIGN PATENT DOCUMENTS

| | | |
|---|---|---|
| JP | 05206298 A | 8/1993 |
| JP | 7-106323 | 4/1995 |
| JP | 8-264647 | 10/1996 |
| JP | 9-213800 | 8/1997 |
| KR | 1998-079828 | 11/1998 |

OTHER PUBLICATIONS

"Stress-Induced Voiding Under Vias Connected to Wide Cu Metal Leads", E.T. Ogawa et al., 2002 IEEE International Reliability Physics Symposium Proceedings, Apr. 7-11, 2002.

(Continued)

*Primary Examiner*—Leonardo Andújar
(74) *Attorney, Agent, or Firm*—McDermott Will & Emery LLP

(57) ABSTRACT

An interconnection is provided with a dummy interconnection connected to an interconnection body, and the dummy interconnection is provided with a stress concentration portion in which tensile stress higher than that of the interconnection body is generated. In proximity to the stress concentration portion, an insulating film formed by high-density plasma CVD is provided, and the tensile stress is generated in the stress concentration portion by the insulating film. With this structure, the occurrence of a void can be prevented at any position in the interconnection body.

4 Claims, 6 Drawing Sheets

OTHER PUBLICATIONS

"Mechanisms of Stress-Induced Voids in Multi-Level Cu Interconnects", Byung-Lyul Park et al., IEEE 2002 International Interconnect Technology Conference, Jun. 3-5, 2002.

"Thermal Stress of 140nm-width Cu damascene interconnects", Norio Okada et al., IEEE 2002 International Interconnect Technology Conference, Jun. 3-5, 2002.

* cited by examiner

US 7,489,040 B2

INTERCONNECTION STRUCTURE OF SEMICONDUCTOR DEVICE

RELATED APPLICATIONS

This application is a continuation of application Ser. No. 10/725,384, filed on Dec. 3, 2003 now U.S. Pat. No. 7,154,184, which in turn claims the benefit of Japanese Patent Application No. 2003-165013, filed on Jun. 10, 2003, the disclosures of which Applications are incorporated by reference herein.

BACKGROUND OF THE INVENTION

1. Field of the Invention

The present invention relates to an interconnection structure of a semiconductor device having an interconnection provided with a stress concentration portion.

2. Description of the Background Art

In an interconnection structure of a semiconductor device, there is a possibility that a void occurs in an interconnection such as a via or the bottom of a via due to stress migration. Further, the void may cause a disconnection in the interconnection, deteriorating the reliability of the semiconductor device.

To prevent the occurrence of a void, for example, in semiconductor devices described in Japanese Patent Laying-Open Nos. 7-106323 and 9-213800, an insulating film having compressive stress is provided on a side of an interconnection, and an insulating film having tensile stress is provided on the top of the interconnection, with both films provided along a longitudinal direction of the interconnection. These interconnection structures aim at relieving stress in the interconnection and preventing stress migration by mutual buffering action between the tensile stress and the compressive stress.

In addition, in a semiconductor device described in Japanese Patent Laying-Open No. 8-264647, a dummy region which is not used as a component of a circuit is provided in the semiconductor device. The dummy region is provided in proximity to an interconnection, apart from the interconnection. This structure aims at preventing the occurrence of a void in an interconnection structure by causing a void to occur preferentially in the dummy region.

In the semiconductor device described in Japanese Patent Laying-Open No. 7-106323, the insulating film having compressive stress and the insulating film having tensile stress are provided so as to contact the interconnection directly, and stress is relieved by mutual buffering action between the compressive stress and the tensile stress. However, this structure of the semiconductor device is insufficient to prevent a void from occurring locally such as at the bottom of a via. Further, there is a possibility that the insulating film on the side of the interconnection having compressive stress and the insulating film on the top of the interconnection having tensile stress both provided for stress relief would rather promote the formation of a void at the bottom of a via and within the interconnection. For example, when the interconnection is a via, the insulating film on the side of the interconnection having compressive stress applies tensile stress to the via, and thus, a void is apt to be formed at the bottom of the via. Furthermore, in the interconnection within an interconnection layer, since the compressive stress and the tensile stress act on the interconnection, stress concentrates at a weak portion within the interconnection such as a crystal grain boundary or the like, reducing bonding strength in the crystal grain boundary or the like. As a result, it is expected that a void is apt to occur in the crystal grain boundary or the like.

In the semiconductor device described in Japanese Patent Laying-Open No. 9-213800, the insulating film having compressive stress is formed directly on the interconnection, and the insulating film having tensile stress is formed so as to embed the insulating film having compressive stress. In this structure, stress relief is promoted by the action of these two insulating films. As for the insulating film formed directly on the interconnection, its compressive stress in a vertical direction is already relieved during its formation process. Thereby, this insulating film applies tensile stress in a horizontal direction to the interconnection. Further, the embedding insulating film applies tensile stress to the interconnection in vertical and horizontal directions. As a result, large tensile stress is generated within the interconnection, raising the possibility that a void is apt to occur in a crystal grain boundary, in a manner similar to that in the semiconductor device described in Japanese Patent Laying-Open No. 7-106323.

In the semiconductor device described in Japanese Patent Laying-Open No. 8-264647, a structurally weak portion that does not contact the interconnection is formed as a dummy region, and stress is relieved by the dummy region. However, although this structure is effective for stress relief of an interconnection layer as a whole, its effect is insufficient for local stress, because the dummy region is far from the interconnection for which stress should be relieved. Further, since the dummy region is formed within the interconnection layer, it is insufficient to relieve local stress generated at such as the bottom of a via. Furthermore, when a portion between the interconnection and the dummy region is formed of a material such as a low-k material having weak mechanical strength, the dummy region provides the effect of the stress relief to a narrower range, further reducing the effect.

SUMMARY OF THE INVENTION

An object of the present invention is to provide an interconnection structure of a semiconductor device in which the occurrence of a void within an interconnection can be restrained at any position.

According to the interconnection structure of a semiconductor device in accordance with the present invention, an interconnection is locally provided with a stress concentration portion in which tensile stress higher than that of another portion of an interconnection is generated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, an interconnection structure of a semiconductor device in respective embodiments will be described.

First Embodiment

Referring to FIGS. 1 to 8, a first embodiment will be described.

Figure 1:
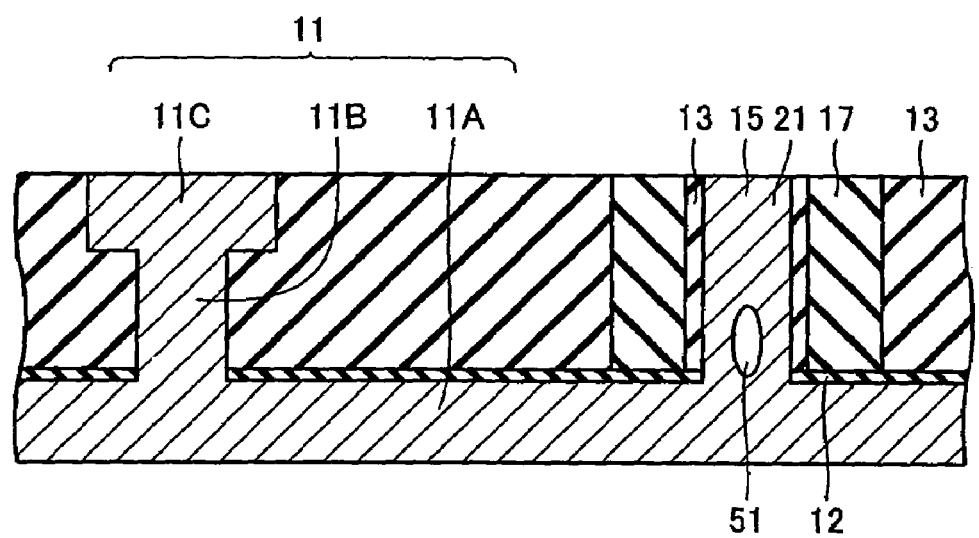
FIG. 1 is a cross-sectional view showing an interconnection structure of a semiconductor device in a first embodiment in accordance with the present invention, illustrating a cross section taken along line I-I in FIG. 2 and viewed in the direction of arrows.
Figure 2:
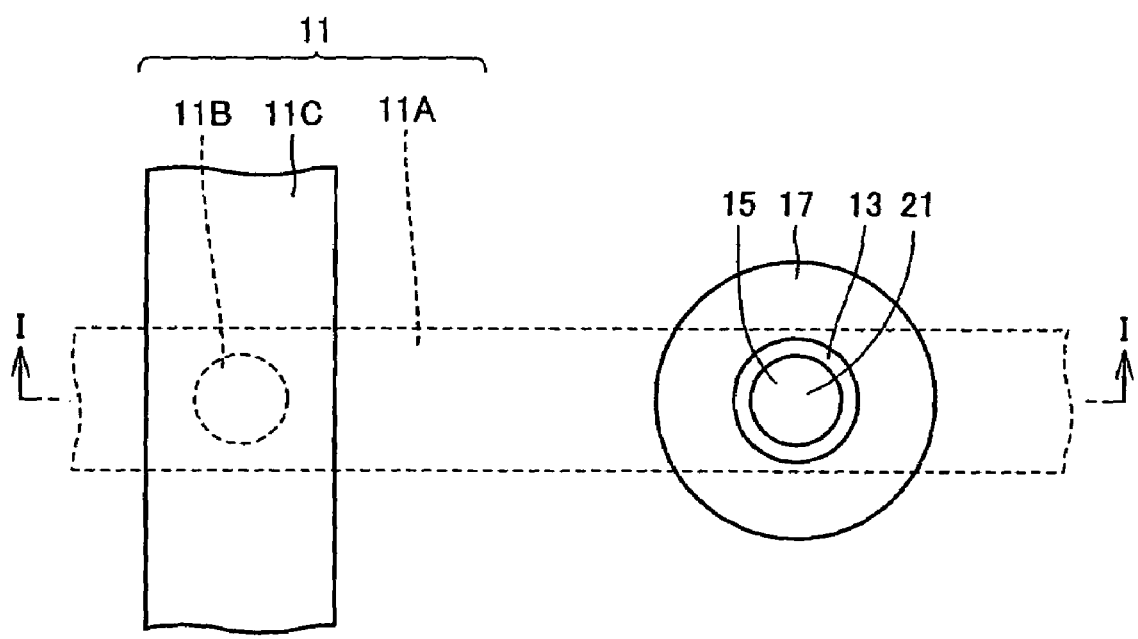
FIG. 2 is a plan view showing the interconnection structure of the semiconductor device in the first embodiment in accordance with the present invention.

Referring to FIGS. 1 and 2, an interconnection structure of a semiconductor device will be described. In the interconnection structure of the present embodiment, an interconnection is provided with a dummy interconnection 15 connected to an interconnection body 11. The whole of dummy interconnection 15 serves as a stress concentration portion 21 in which tensile stress higher than that of interconnection body 11 is generated.

Interconnection body 11 is an interconnection required for constituting a circuit in the semiconductor device, and is made of Cu. FIG. 1 illustrates a lower interconnection 11A, an upper interconnection 11C, and a via 11B connecting lower interconnection 11A and upper interconnection 11C, as interconnection body 11.

Dummy interconnection 15 is an interconnection unnecessary for constituting a circuit in the semiconductor device, and is a portion in which even the occurrence of a void would have little effect on the operation, performance, and the like of the semiconductor device. Dummy interconnection 15 is formed so as to be connected to interconnection body 11. Here, dummy interconnection 15 is formed of a cylindrical via extending upward from lower interconnection 11A. Dummy interconnection 15, as well as interconnection body 11, is made of Cu. Interconnection body 11 and dummy interconnection 15 may be made of a material other than Cu, for example, Al, Ag, or Au. They may also be made of a material containing Cu, Al, Ag, or Au.

An insulating film 17 is provided so as to surround the periphery of dummy interconnection 15 via a thin interlayer film 13 about 100 nm thick. Insulating film 17 is a SiN film deposited by high-density plasma CVD (Chemical Vapor Deposition), and has internal stress of compression. By insulating film 17, tensile stress acts on the whole of dummy interconnection 15 in contact with insulating film 17. The tensile stress acts mainly in a longitudinal direction of dummy interconnection 15 (a vertical direction in FIG. 1). As a result, the whole of dummy interconnection 15 serves as stress concentration portion 21 in which tensile stress higher than that of interconnection body 11 is generated.

In the present embodiment, hollow cylindrical insulating film 17 is provided so as to surround the whole of dummy interconnection 15. Insulating film 17 having internal stress of compression may be provided at a position corresponding to only part of dummy interconnection 15 so as to provide stress concentration portion 21 at the part of dummy interconnection 15. Specifically, hollow cylindrical insulating film 17 may be provided so as to surround a portion corresponding to only part of dummy interconnection 15 in its longitudinal direction (vertical direction in FIG. 1). Further, dummy interconnection 15 may be formed in a shape of a prism or a plate, for example, and provided with plate-shaped or column-shaped insulating film 17 in proximity to one or a plurality of its side surfaces.

By forming stress concentration portion 21 having high tensile stress in dummy interconnection 15, the formation of a void 51 in stress concentration portion 21 is promoted. Since dummy interconnection 15 is connected to interconnection body 11, stress migration occurs, and vacancies and micro-voids in interconnection body 11 concentrate at stress concentration portion 21. As a result, vacancies and micro-voids are reduced in interconnection body 11. Thus, the formation of void 51 in stress concentration portion 21 is promoted. On the contrary, in proximity to a portion of interconnection body 11 to which dummy interconnection 15 is connected, the occurrence of a void is restrained. Thereby, quality deterioration due to the occurrence of void 51 can be restrained, improving the reliability of the semiconductor device.

Here, as for stress acting from hollow cylindrical insulating film 17 to dummy interconnection 15, tensile stress is generated in the longitudinal direction of dummy interconnection 15 (vertical direction in FIG. 1). On the other hand, compressive stress is expected to be generated in a radial direction of dummy interconnection 15. To concentrate void 51 in stress concentration portion 21 of dummy interconnection 15 by stress migration, tensile stress should be generated in stress concentration portion 21. Accordingly, insulating film 17 has a sufficiently long length in its axial direction, relative to a thickness in its radial direction. Further, similar effect can also be obtained by sufficiently reducing the thickness of hollow cylindrical insulating film 17 in the radial direction.

The tensile stress generated in stress concentration portion 21 is preferably not less than 200 MPa nor more than 400 MPa. If the tensile stress is less than 200 MPa, the effect of restraining the occurrence of a void in interconnection body 11 is insufficient. If the tensile stress exceeds 400 MPa, dummy interconnection 15 may break. Tensile strengths of Al and Cu each used as a main component of an interconnection material are about 47 MPa and 210 MPa, respectively. Thus, in a tension test using each of Al and Cu as a bulk material, Al and Cu break at the foregoing respective values. However, tensile strength of a material used in a structure which is minute and surrounded by an insulating film, such as an LSI interconnection, is higher than that of the material in the state of a bulk material. In the case of Cu, although a break hardly occurs when tensile stress is up to about 400 MPa, dummy interconnection 15 may break if the tensile stress exceeds 400 MPa. When dummy interconnection 15 breaks, stress within the dummy interconnection is completely relieved, having no effect of concentrating vacancies and micro-voids in stress concentration portion 21. To concentrate vacancies and micro-voids efficiently, a stress gradient should be formed between interconnection 11A and dummy interconnection 15 without breaking the dummy interconnection. To form such a stress gradient, the tensile stress is preferably not more than 400 MPa, which will cause no break in dummy interconnection 15.

When strong tensile stress exceeding 400 MPa is applied to dummy interconnection 15, interlayer film 13 surrounding dummy interconnection 15 also undergoes similarly greater stress. When such strong stress is applied, there arises a possibility that a crack occurs in surrounding interlayer film 13. Also from this viewpoint, the tensile stress generated in stress concentration portion 21 is preferably not more than 400 MPa.

Preferably, dummy interconnection 15 and stress concentration portion 21 are provided in a portion of interconnection body 11 where void 51 is apt to occur. Examples of the portion where void 51 is apt to occur include a portion adjacent to a thick interconnection having a large absolute amount of vacancies and micro-voids, and a portion structurally subjected to high tensile stress. Since dummy interconnection 15 and stress concentration portion 21 can be provided locally at any position in interconnection body 11, the occurrence of void 51 can be prevented at any position in interconnection body 11. Further, in the present embodiment, since dummy interconnection 15 is formed of a via, dummy interconnection 15 and stress concentration portion 21 can be formed without an increase in the area of the semiconductor device.

Further, the structure of the present embodiment is particularly effective for an interconnection made of Cu, in which a void is apt to occur due to the reason described below. To achieve speeding-up of a semiconductor device, interconnection delay, that is, RC (resistance-capacitance) delay becomes a problem. The RC delay is determined by the product of resistance of an interconnection and capacitance of the interconnection. Thus, when speeding-up is required, an interconnection made of Cu or an interconnection made of a Cu alloy each having less resistivity than that of a conventionally used interconnection made of Al or an Al alloy is employed. Unlike the case of Al, it is difficult to process an interconnection containing Cu by etching. Therefore, it is formed by an interconnection filling process called damascene.

In the damascene process, a concave portion such as a connection hole or an interconnection trench is formed in an insulating film, and the concave portion is filled with Cu. Thereafter, CMP (Chemical Mechanical Polishing) is performed for planarization. In the step of filling the concave portion with Cu, ECP (Electrochemical Plating), CVD or the like is used, and ECP is mainly used as it is superior in terms of cost and the like.

A Cu plating film formed by ECP has characteristics that it contains a number of vacancies and micro-voids, it has tensile stress, and that growth of crystal grains is observed at a low temperature (100° C. or less). Due to these characteristics, when such a film is maintained at a low temperature, vacancies and micro-voids are released, along with the growth of crystal grains. The vacancies and micro-voids diffuse into a portion having high tensile stress in an interconnection containing Cu (stress migration), in which a void is apt to be formed. Therefore, for a material in which a void is apt to occur, such as an interconnection made of a Cu plating film formed by ECP, it is particularly effective to provide dummy interconnections 15 and stress concentration portions 21 locally with an appropriate interval. Thereby, void 51 can be concentrated in stress concentration portion 21, and the occurrence of void 51 in interconnection body 11 containing Cu can be restrained.

Figure 3:
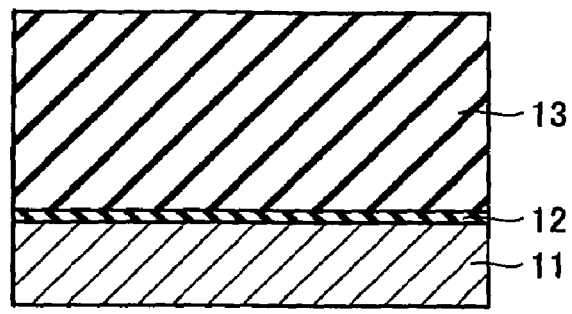
FIGS. 3 to 8 are cross-sectional views showing a process of manufacturing the interconnection structure of the semiconductor device in the first embodiment in accordance with the present invention.

Referring to FIGS. 3 to 8, a method of manufacturing the interconnection structure of the present embodiment will be described. Referring to FIG. 3, a cap film 12 is stacked on interconnection body 11 containing Cu. Cap film 12 is formed as an etching stopper and to prevent the diffusion of Cu, and here, it is a SiN film formed by plasma CVD. Interlayer film 13 is stacked on cap film 12. Interlayer film 13 is formed of a low-k film which is an insulating film having a low dielectric constant. In the case of a semiconductor device for which speeding-up is not particularly required, interlayer film 13 can be formed of another insulating material such as $SiO_2$.

Figure 4:
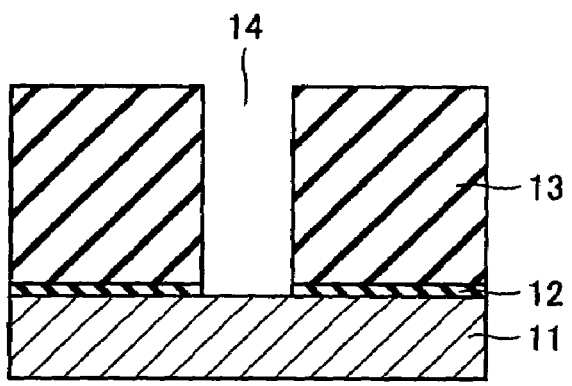

Referring to FIG. 4, interlayer film 13 is etched to form an opening 14 to be filled with dummy interconnection 15. Here, cap film 12 is also removed by etching together with interlayer film 13.

Figure 5:
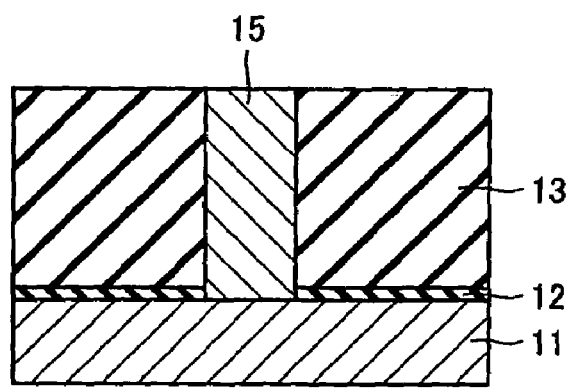

Referring to FIG. 5, a barrier film and a Cu seed film which are not shown are formed on an inner surface of opening 14. As the barrier film, a Ta film, a TaN film, a WN film or the like is used. The Cu seed film is formed by stacking Cu by sputtering. Next, by ECP, opening 14 is filled with a Cu film which will be dummy interconnection 15. Then, unnecessary portions of the Cu film and the barrier film are removed by CMP.

Figure 6:
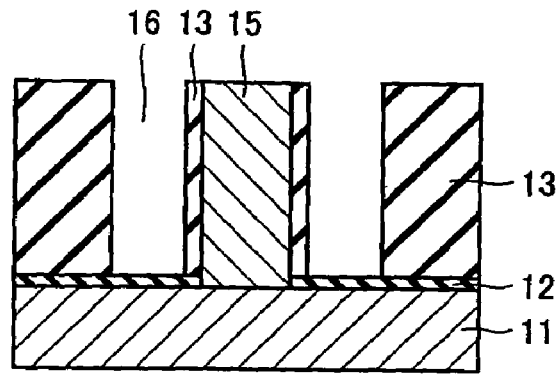

Referring to FIG. 6, etching is performed to form a hollow cylindrical opening 16 around dummy interconnection 15, leaving about 100 nm thick interlayer film 13 around dummy interconnection 15. In this step, cap film 12 is not removed.

Figure 7:
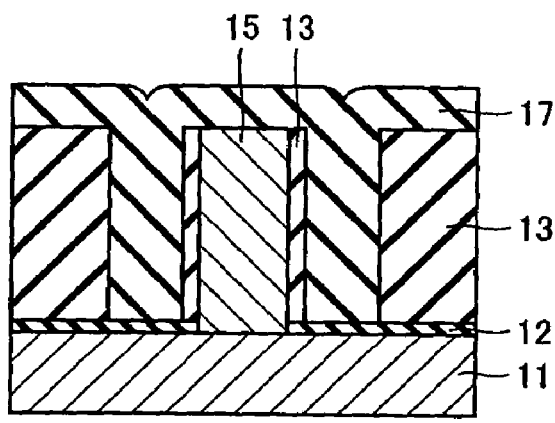

Referring to FIG. 7, high-density plasma CVD is performed to fill opening 16 with insulating film 17 made of a SiN film. By using high-density plasma CVD, high internal stress of compression remains in insulating film 17. At this stage, the magnitude of the internal stress remaining in insulating film 17 can be adjusted by the method described below. In the case of a high-density plasma CVD device, compressive stress of insulating film 17 can be increased by increasing source power and bias power. In the case of a parallel plate plasma CVD device, compressive stress of insulating film 17 can be increased by reducing the flow rate of $SiH_4$ gas, or reducing the pressure during deposition. Further, in the case of a dual frequency excitation parallel plate plasma CVD device, compressive stress of insulating film 17 can be increased by increasing the power of a low excitation frequency on the order of KHz.

Figure 8:
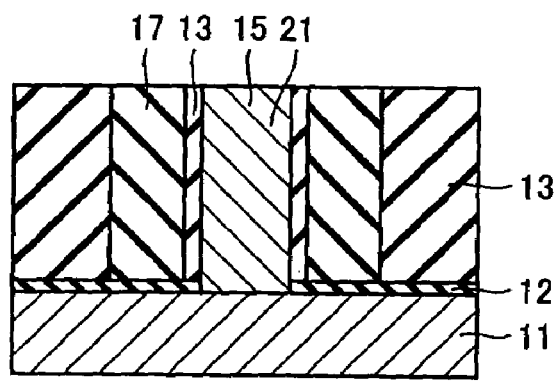

Finally, referring to FIG. 8, an unnecessary portion of the SiN film on the surface of interlayer film 13 is removed by CMP. With the foregoing steps, dummy interconnection 15 and stress concentration portion 21 connected to interconnection body 11 can be formed.

As described above, in the present embodiment, insulating film 17 is provided to dummy interconnection 15 via about 100 nm thick interlayer film 13. In other words, insulating film 17 is provided in proximity to dummy interconnection 15. In this manner, insulating film 17 and dummy interconnection 15 do not have to contact each other directly, and it is satisfactory as long as insulating film 17 is provided in proximity to dummy interconnection 15 such that the stress of insulating film 17 fully acts on dummy interconnection 15.

Second Embodiment

In the following, a second embodiment will be described with reference to FIGS. 9 to 14.

Figure 9:
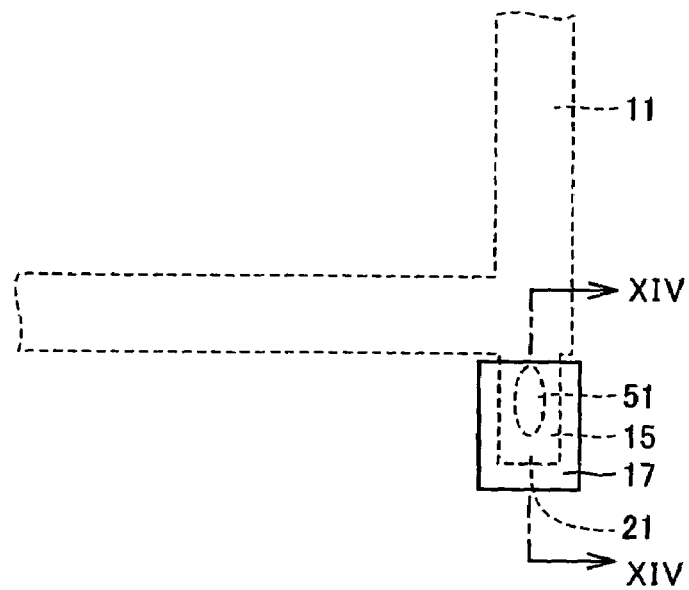
FIG. 9 is a plan view showing an interconnection structure of a semiconductor device in a second embodiment in accordance with the present invention.
Figure 10:
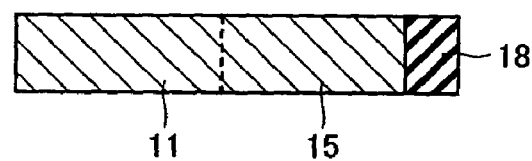
FIGS. 10 to 14 are cross-sectional views showing a process of manufacturing the interconnection structure of the semiconductor device in the second embodiment in accordance with the present invention, corresponding to a cross section taken along line XIV-XV in FIG. 9 and viewed in the direction of arrows.

Referring to FIG. 9, an interconnection structure of a semiconductor device will be described. It is to be noted that a structure corresponding to that in the first embodiment will be identified by a reference number identical to that in the first embodiment, and description thereof will not be repeated here. In the interconnection structure of the present embodiment, an interconnection is provided with an interconnection laterally extending from interconnection body 11, as dummy interconnection 15 connected to interconnection body 11. Substantially the whole of dummy interconnection 15 serves as stress concentration portion 21 in which tensile stress higher than that of interconnection body 11 acts.

In the present embodiment, dummy interconnection 15 is provided in the same layer as interconnection body 11. Although interconnection body 11 and dummy interconnection 15 are made of Cu or a metal containing Cu such as a Cu alloy, they may be made only of a metal other than Cu. Over dummy interconnection 15, insulating film 17 is provided so as to contact dummy interconnection 15 directly. Insulating film 17 is a SiN film formed by high-density plasma CVD, and has internal stress of compression. Thus, tensile stress from insulating film 17 acts through an upper surface of dummy interconnection 15 in contact with insulating film 17, and tensile stress is generated in substantially the whole of dummy interconnection 15.

As shown in FIG. 9, insulating film 17 is formed so as to cover the whole of the upper surface of dummy interconnection 15 other than a base of dummy interconnection 15, and further, such that its three sides protrude beyond the upper surface of dummy interconnection 15. As a result, substantially the whole of dummy interconnection 15 serves as stress concentration portion 21 in which tensile stress higher than that of interconnection body 11 is generated. In the present embodiment, since insulating film 17 is formed so as not to cover the base of dummy interconnection 15, interconnection body 11 and insulating film 17 do not contact each other. This makes it difficult for compressive stress of insulating film 17 to act on interconnection body 11. Further, insulating film 17 having internal stress of compression may be provided so as to contact only part of dummy interconnection 15 to form stress concentration portion 21 at the part of dummy interconnection 15. For example, insulating film 17 may be provided so as to contact only a tip portion of dummy interconnection 15 apart from interconnection body 11, to further reduce the influence on interconnection body 11.

By forming stress concentration portion 21 having high tensile stress in dummy interconnection 15, the formation of void 51 in stress concentration portion 21 is promoted, and stress migration occurs. Thus, the occurrence of void 51 in proximity to a portion of interconnection body 11 to which dummy interconnection 15 is connected can be restrained, improving the reliability of the semiconductor device.

Preferably, dummy interconnection 15 and stress concentration portion 21 are locally provided in a portion of interconnection body 11 where void 51 is apt to occur. It is known that void 51 is apt to occur in a portion where a lower interconnection and a via are connected, that is, the bottom of the via, because the portion is structurally subjected to high tensile stress. In the present embodiment, since dummy interconnection 15 is provided laterally, that is, in the same layer that is provided with interconnection body 11, dummy interconnection 15 can be connected to a side of interconnection body 11 constituting the bottom of a via, for example. In this case, the occurrence of void 51 at the bottom of the via can be restrained.

Referring to FIGS. 10 to 14, a method of manufacturing the interconnection structure of the present embodiment will be described. First, referring to FIG. 10, dummy interconnection 15 is formed at the same time when forming interconnection body 11 containing Cu.

Figure 11:
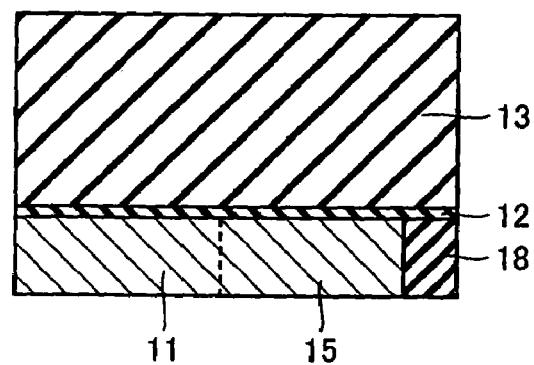

Referring to FIG. 11, cap film 12 is stacked on interconnection body 11 and dummy interconnection 15. Cap film 12 is a SiN film formed by plasma CVD. Interlayer film 13 is stacked on cap film 12. Interlayer film 13 is formed of a low-k film which is an insulating film having a low dielectric constant.

Figure 12:
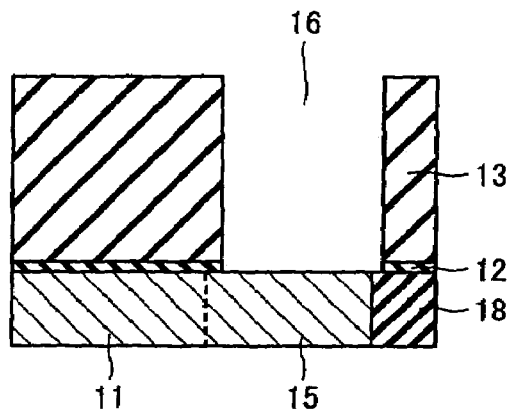

Referring to FIG. 12, interlayer film 13 is etched to form opening 16 to be filled with insulating film 17. Opening 16 is formed so as to cover the whole of the upper surface of dummy interconnection 15 other than the base of dummy interconnection 15. Here, cap film 12 is also removed by etching together with interlayer film 13.

Figure 13:
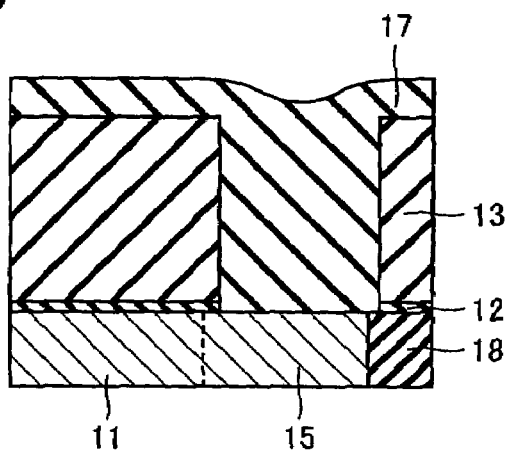

Referring to FIG. 13, high-density plasma CVD is performed to fill opening 16 with insulating film 17 made of a SiN film. By using high-density plasma CVD, high internal stress of compression remains in insulating film 17.

Figure 14:
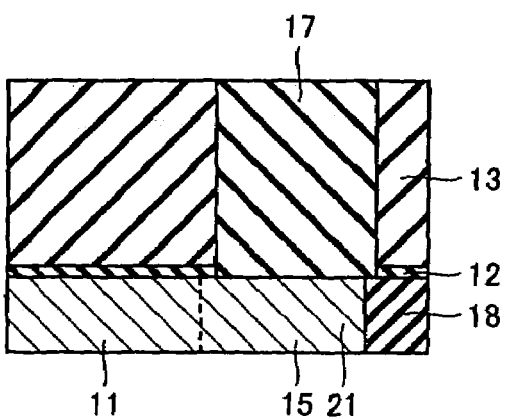

Finally, referring to FIG. 14, an unnecessary portion of the SiN film on the surface of interlayer film 13 is removed by CMP. With the foregoing steps, insulating film 17 directly in contact with substantially the whole of the upper surface of dummy interconnection 15 can be formed. Thus, tensile stress from insulating film 17 acts, and substantially the whole of dummy interconnection 15 can serve as stress concentration portion 21.

Although a SiN film is deposited by high-density plasma CVD to form insulating film 17 in the foregoing two embodiments, insulating film 17 is not limited to this. Any film can be used as long as it has internal stress of compression and does not deteriorate an interconnection containing Cu. For example, a sputtered film having internal stress of compression, such as a TiN film formed by sputtering, can be used. Insulating films such as a TEOS (Tetra Ethyl Ortho Silicate) film deposited by plasma CVD and an oxide film deposited by high-density plasma CVD can also be used.

Figure 15:
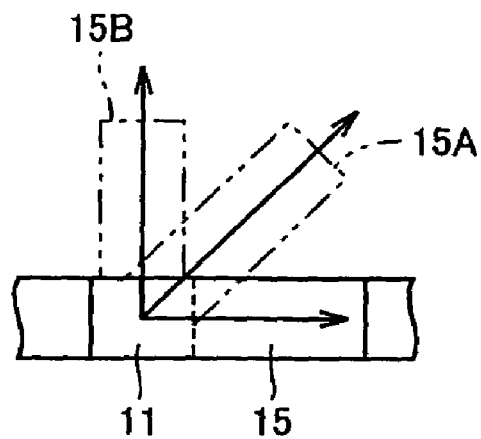
FIG. 15 is a vertical cross-sectional view showing directions in which a dummy interconnection extends.

FIG. 15 is a vertical cross-sectional view showing directions in which dummy interconnection 15 extends. As shown in FIG. 15, in the second embodiment, dummy interconnection 15 is provided in the same layer as interconnection body 11 so as to extend laterally. Further, in the first embodiment, vertically extending dummy interconnection 15B is provided. The dummy interconnection may extend in a different direction. For example, an obliquely extending dummy interconnection 15A may be provided.

Figure 16:
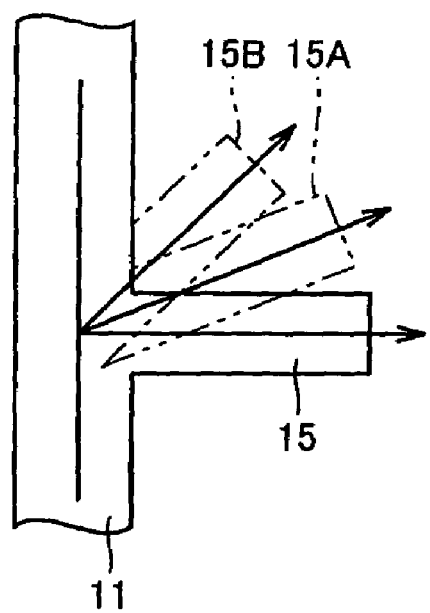
FIG. 16 is a plan view showing directions in which the dummy interconnection extends.

FIG. 16 is a plan view showing directions in which dummy interconnection 15 extends. As shown in FIG. 16, in the second embodiment, dummy interconnection 15 is provided so as to extend in a direction perpendicular to the direction in which interconnection body 11 extends. The direction of interconnection body 11 is not limited to this, and dummy interconnection 15A or dummy interconnection 15B intersecting interconnection body 11 obliquely may be provided. In this manner, the direction in which dummy interconnection 15 extends can freely be set relative to the direction in which interconnection body 11 extends. It is satisfactory as long as dummy interconnection 15 and interconnection body 11 contact each other at any position.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection structure of a semiconductor device having a dummy interconnection electrically connected to an interconnection forming a portion of a circuit, said dummy interconnection provided with a stress concentration portion having tensile stress higher than that of said interconnection generated therein, and
   wherein the tensile stress in said stress concentration portion is not less than 200 MPa nor more than 400 Mpa, and
   wherein the material of said dummy interconnection is made of a material including Cu, Al, Ag, or Au.

2. The interconnection structure of a semiconductor device according to claim 1, wherein said dummy interconnection has a first end portion and a second end portion, said first end portion electrically connected to said interconnection and said second end portion electrically disconnected.

3. The interconnection structure of a semiconductor device according to claim 2, wherein said dummy interconnection is formed of a via.

4. The interconnection structure of a semiconductor device according to claim 1, wherein the tensile stress is generated in said stress concentration portion by providing an insulating film having internal stress of compression, in proximity to said stress concentration portion or in contact with said stress concentration portion.

* * * * *